United States Patent
Ori

(10) Patent No.: US 6,829,284 B2
(45) Date of Patent: Dec. 7, 2004

(54) LIGHT SOURCE DEVICE AND OPTICAL PICKUP

(75) Inventor: Yuichiro Ori, Moriyama (JP)

(73) Assignee: Minolta Co., Ltd., Osaka (JP)

( * ) Notice: Subject to any disclaimer, the term of this patent is extended or adjusted under 35 U.S.C. 154(b) by 46 days.

(21) Appl. No.: 10/302,122

(22) Filed: Nov. 22, 2002

(65) Prior Publication Data

US 2003/0128439 A1 Jul. 10, 2003

(30) Foreign Application Priority Data

Dec. 14, 2001 (JP) ........................................ 2001-380902

(51) Int. Cl.$^7$ ................................................ H01S 3/08
(52) U.S. Cl. ....................... 372/101; 359/668; 359/708; 359/710; 359/719
(58) Field of Search .................. 372/101, 98; 359/668, 359/708, 710, 719

(56) References Cited

U.S. PATENT DOCUMENTS

| | | | | |
|---|---|---|---|---|
| 5,237,451 A | * | 8/1993 | Saxe | ........................... 359/565 |
| 5,467,335 A | * | 11/1995 | Braat | ..................... 369/112.23 |
| 5,973,853 A | | 10/1999 | Gaebe et al. | ................ 359/668 |
| 6,026,206 A | * | 2/2000 | Gaebe | .......................... 385/33 |
| 6,347,015 B2 | * | 2/2002 | Ando | .......................... 359/719 |

* cited by examiner

*Primary Examiner*—Don Wong
*Assistant Examiner*—Leith A Al-Nazer
(74) *Attorney, Agent, or Firm*—Sidley Austin Brown & Wood LLP

(57) ABSTRACT

A light source device has a semiconductor laser for emitting an elliptical divergent beam having a light intensity distribution in an elliptical form; and a beam shaping element for converting an elliptical divergent beam from said semiconductor laser into an approximately circular divergent beam having a light intensity distribution in an approximately circular form; wherein the beam shaping element has a first surface formed of a cylindrical surface and a second surface formed of an anamorphic surface, in order from said semiconductor laser side, and satisfies the predetermined conditional expressions.

22 Claims, 3 Drawing Sheets

LIGHT SOURCE DEVICE AND OPTICAL PICKUP

RELATED APPLICATION

This application is based on application No. 2001-380902 filed in Japan, the content of which is hereby incorporated by reference

1. Field of the Invention

The present invention relates to a light source device and an optical pickup, in particular, to a light source device that emits a divergent beam having a light intensity distribution in approximately a circular form and to an optical pickup (in particular, a high density optical recording and reproduction pickup) using the same.

2. Description of the Prior Art

A semiconductor laser, such as of an LD (laser diode), is used as a light source in a conventional optical pickup. Since a divergent beam emitted from a semiconductor laser has a cross section in an elliptical form (that is to say, the light intensity distribution is in an elliptical form), it is necessary to convert an elliptical beam from a semiconductor laser to a circular beam in an optical recording and reproduction device wherein a high light utilization efficiency is required. In practice, an anamorphic prism is used as a beam shaping element for reshaping the form of the beam cross section from an elliptical form to a circular form. However, it is necessary to utilize an anamorphic prism in a parallel light flux and adjustment is difficult, and miniaturization is limited. On the other hand, a finite system-type beam shaping element using an anamorphic lens or a diffraction optical element is known as a beam shaping element for reshaping the cross sectional form of a divergent beam from an elliptical form to a circular form. Such a beam shaping element can be placed in the vicinity of a semiconductor laser and is effective for integration and for miniaturization.

However, a high precision for positioning, in the optical axis direction, the semiconductor laser relative to a beam shaping element is required in the beam shaping element formed of the above described anamorphic lens, and the like. In particular, the absolute amount of wave front aberration that is tolerable becomes more restricted due to the shorter wavelength in the beam shaping element of a high density optical recording and reproduction device using a next-generation blue semiconductor laser. Accordingly, a higher positioning precision than ever is required in the optical axis direction. It is difficult to restrict the occurrence of astigmatic difference due to change in the environmental temperature, even in the case that such a high positioning precision can be achieved. The light source device proposed in U.S. Pat. No. 5,467,335 is cited as a light source device having the object of being stable in regard to change in environment. However, such a light source device is difficult to manufacture because the distance between the beam shaping element and the semiconductor laser is extremely small (approximately several tens of $\mu$m).

SUMMARY OF THE INVENTION

A purpose of the present invention is to provide an improved light source device and an optical pickup.

Another purpose of the present invention is to provide a light source device that can emit a divergent beam in approximately a circular form while restricting the occurrence of astigmatic difference due to change in the environmental temperature and that is easy to manufacture, as well as to provide a compact optical pickup using the same.

The above described purposes are achieved by providing a light source device having the following configuration:

a semiconductor laser for emitting an elliptical divergent beam having a light intensity distribution in an elliptical form; and a beam shaping element for converting an elliptical divergent beam from the above described semiconductor laser into an approximately circular divergent beam having a light intensity distribution in an approximately circular form;

wherein the beam shaping element has a first surface formed of a cylindrical surface and a second surface formed of an anamorphic surface, in order from the above described semiconductor laser side, and satisfies the following conditional expressions (1) and (2) when the direction parallel to the minor axis of the ellipse of the elliptical divergent beam is the X direction and the direction parallel to the major axis of the ellipse of the elliptic divergent beam is the Y direction:

$$\theta X < \theta X' < n\theta X \qquad (1)$$

$$\theta Y > \theta Y' > (1/n)\theta Y \qquad (2)$$

where $\theta X$ is the angle of spread in the X direction of the elliptical divergent beam from the semiconductor laser;

$\theta Y$ is the angle of spread in the Y direction of the elliptical divergent beam from the semiconductor laser;

$\theta X'$ is the angle of spread in the X direction of the approximately circular divergent beam from the beam shaping element;

$\theta Y'$ is the angle of spread in the Y direction of the approximately circular divergent beam from the beam shaping element; and n is the index of refraction of the beam having the design wavelength of the beam shaping element.

In addition, the above described purposes are achieved by providing a light source device having the following configuration:

a semiconductor laser for emitting an elliptical divergent beam having a light intensity distribution in an elliptical form; and a beam shaping element for converting an elliptical divergent beam from the above described semiconductor laser into an approximatly circular divergent beam having a light intensity distribution in an approximately circular form;

wherein the beam shaping element has a first surface formed of a cylinder surface and a second surface formed of an anamorphic surface in order from the above described semiconductor laser side and is characterized by satisfying the following conditional expressions (3), (4) and (5):

$$n > 1.6 \qquad (3)$$

$$1.1n < M < 1.5n \qquad (4)$$

$$s/t \neq (n - M/n)/(M - 1) \qquad (5)$$

where n is the index of refraction of the beam having the design wavelength of the beam shaping element;

M is the shaping magnification of the beam shaping element;

s is the distance between the light emission point of the semiconductor laser and the first surface of the beam shaping element; and t is the thickness of the core of the beam shaping element.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

In the following, a light source device and an optical pickup gained by implementing the present invention are described in reference to the drawings. Here, X, Y and Z indicate directions perpendicular to each other in the respective drawings wherein the Z direction is the direction parallel to the optical axis (AX), the X direction is the direction parallel to the minor axis of the ellipse of the elliptical divergent beam and the Y direction is the direction parallel to the major axis of elliptical divergent beam.

[Embodiment of Light Source Device]

Figure 1:
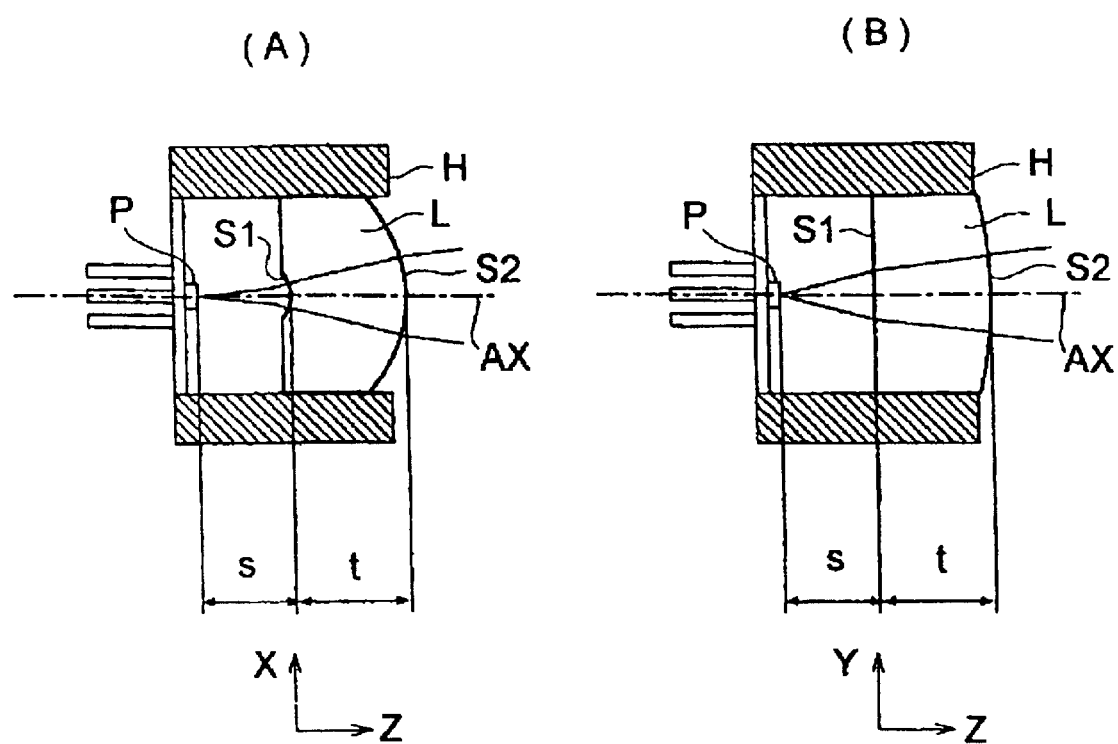
FIGS. 1(A) and 1(B) are cross sectional diagrams showing an embodiment of the light source device.

FIG. 1 shows an embodiment of a light source device. FIG. 1(A) shows an XZ cross section and FIG. 1(B) shows a YZ cross section. This light source device is provided with a semiconductor laser (P) for emitting an elliptical divergent beam having a light intensity distribution in an elliptical form, with a single finite system beam shaping element (L) for converting an elliptical divergent beam from this semiconductor laser (P) to an approximately circular divergent beam having a light intensity distribution in an approximately circular form, and with a support member for holding them in an integrated condition. The beam shaping element (L) is formed of a finite system-type single lens not having a collimating function and, therefore, an integrated and miniaturized light source unit structure can easily be formed through integration with the semiconductor laser (P) via the support member (H). Then, miniaturization of an optical pickup can be achieved using this light source device.

The beam shaping element (L) has a first surface (S1) having a cylindrical surface and a second surface (S2) having an anamorphic surface, in order from the semiconductor laser (P) side. Then, according to this configuration, the focal distance in the XZ cross section differs from that in the YZ cross section, and the NA (numerical aperture) conversion is carried out at the same time as beam shaping. In a single beam shaping element, of which both surfaces are cylindrical, the angle of spread in the Y direction (that is to say, the direction of the major axis of the ellipse) cannot be changed and, therefore, an NA conversion function cannot be added. As shown in FIG. 1, in the case that the first surface (S1) has a cylindrical surface and the second surface (S2) has an anamorphic surface, an NA conversion function can be added to a finite system-type beam shaping element (A). Such a beam shaping element (L), of a type having one anamorphic surface, has the merit that manufacture can easily be carried out in comparison with the type having two anamorphic surfaces.

It is desirable for the first surface (S1) to have a cylindrical surface of a spherical form, of which the radius of curvature is not extremely small. Thereby, fabrication and evaluation become easy and centering in regard to the anamorphic surface, which forms the second surface (S2), becomes easy in comparison with a beam shaping element wherein both surfaces are of an anamorphic form. Here, the first surface (S1) may have a cylindrical surface of a non-spherical form. In the case that the first surface (S1) is a cylindrical surface of a non-spherical form, it becomes possible to improve the performance outside of the axis, even though difficulty of fabrication and of evaluation is increased in comparison with the case of a cylindrical surface of a spherical form. Accordingly, the alignment tolerance is widened and a beam shaping element (L) that is stable in regard to fluctuation in environmental conditions can be implemented.

In a light source device having a cylindrical surface and an anamorphic surface in a single infinite system beam shaping element (L), such as of the present embodiment, it is desirable to satisfy the following conditional expressions (1) and (2):

$$\theta X < \theta X' < n\theta X \quad (1)$$

$$\theta Y > \theta Y' > (1/n)\theta Y \quad (2)$$

where $\theta X$ is the angle of spread in the X direction (direction of the minor axis of the ellipse) of an elliptical divergent beam from the semiconductor laser (P);

$\theta Y$ is the angle of spread in the Y direction (direction of the major axis of the ellipse) of an elliptical divergent beam from the semiconductor laser (P) ($\theta Y > \theta X$);

$\theta X'$ is the angle of spread in the X direction (direction of the minor axis of the ellipse) of an approximately circular divergent beam from the beam shaping element (L);

$\theta Y'$ is the angle of spread in the Y direction (direction of the major axis of the ellipse) of an approximately circular divergent beam from the beam shaping element (L); and n is the index of refraction of the design wavelength of the beam shaping element (L).

In regard to the gaining of a desired shaping magnification (=$\theta Y/\theta X$), the degree of freedom of selection of materials for the beam shaping element (L) becomes great when conditional expressions (1) and (2) are satisfied. In addition, manufacture of the beam shaping element (L), and of a light source device using this, becomes easy. In the case that conditional expressions (1) and (2) are not satisfied, it becomes difficult to secure a desired shaping magnification and, then, the radius of curvature of the beam shaping element (L) becomes small, and the distance between the beam shaping element (L) and the semiconductor laser (P) becomes extremely small so that manufacture becomes difficult.

In addition, it is desirable for the following conditional expressions (3), (4) and (5) to be satisfied regarding a light source device having a cylindrical surface and an anamorphic surface in the single and infinite system beam shaping element as in the present embodiment:

$$n > 1.6 \quad (3)$$

$$1.1n < M < 1.5n \quad (4)$$

$$s/t \neq (n - M/n)/(M-1) \quad (5)$$

where n is the index of refraction of the design wavelength of the beam shaping element (L);

M is the shaping magnification of the beam shaping element (L);

s is the distance between the point of light emission of the semiconductor laser (P) and the first surface (S1) of the beam shaping element (L) and t is the thickness of the core of the beam shaping element (L).

Even when change in the index of refraction due to change in the environmental temperature or change in the index of refraction with accompanying wavelength fluctuation due to change in the environmental temperature occur, wave front aberration due to the occurrence of astigmatic difference can be effectively controlled while maintaining a sufficient shaping magnification M and a sufficient NA conversion function in the case that optimal values are selected for the index of refraction n and for the s/t ratio in order to satisfy the above described conditional expressions (3) to (5). Accordingly, it becomes possible to emit an approximately circular divergent beam while preventing the occurrence of astigmatic difference due to change in the environmental temperature.

Within the range of conditions according to the above described expressions (3) to (5), a substantially sufficient shaping magnification M of approximately 1.8 to 2.4 is gained and, according to the configuration, the NA conversion function can be provided. In addition, it becomes unnecessary to make the distance s smaller, as the index of refraction n of the beam shaping element (L) is greater and, therefore, it is possible to make the value of the s/t ratio 0.4 or greater by selecting the material having an index of refraction n close to the shaping magnification M, within the range of conditions of the above described conditional expressions (3) to (5). Accordingly, in the case of the beam shaping element (L) having a core of an appropriate thickness t (1 to several mm), a configuration can be gained wherein the distance s between the semiconductor laser (P) and the beam shaping element (L) is not extremely small and, therefore, the radius of curvature of the cylindrical surface forming the first surface (S1) can be secured to a size of a specific degree (that is to say, the curvature is made gentle) so that manufacture (formation, processing, and the like) of the beam shaping element (L) becomes easy.

When the range of conditional expression (3) is not satisfied, the distance s becomes extremely small in order to secure the shaping magnification M at a predetermined value, or greater. Accordingly, manufacture of the beam shaping element (L) becomes difficult. When the lower limit of the conditional expression (4) is exceeded, a sufficient shaping magnification M cannot be gained and, when the upper limit of the conditional expression (4) is exceeded, the shaping magnification M becomes greater than necessary so that the choice of materials for the beam shaping element (L) is narrowed. In addition, it becomes difficult to gain an approximately circular divergent beam when the conditions of conditional expression (5) are not satisfied.

In order to satisfy the above described conditional expression (3) to (5), it is preferable to use a glass material as the configuration material of the beam shaping element (L). This is because mass production of a glass mold formation of the beam shaping element (L) having an anamorphic surface, or the like, is easy using a metal mold for a precise lens having a small diameter. In addition, it is desirable for an approximately circular divergent beam shaped by the beam shaping element (L) to be made up of spherical surface waves. A beam shaping element, of which both surfaces are cylindrical, cannot avoid the occurrence, even though slight, of spherical surface aberration in the beam after shaping. When spherical surface waves are gained by selecting an anamorphic non-spherical surface for the second surface (S2), the beam after shaping can be made to be free of aberration. Therefore, there is the merit wherein the element can be utilized in a versatile manner in the case, for example, of the configuration in which the semiconductor laser (P) is integrated.

Figure 2:
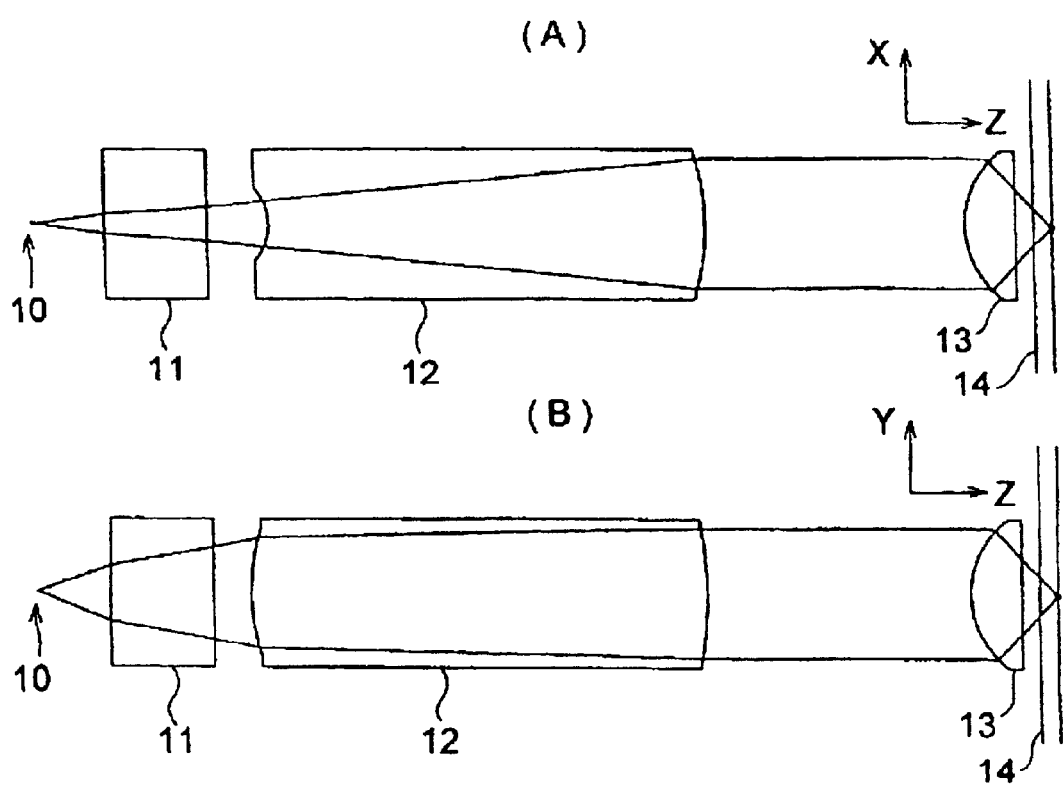
FIGS. 2(A) and 2(B) are optical configuration diagrams showing an optical pickup system having a beam shaping element with a collimator function according to a prior art.

As described above, a light source device satisfying the conditional expressions (3) to (5) can have a configuration wherein the distance s is not extremely small and, even in the case that the distance s between the semiconductor laser (P) and the beam shaping element (L) changes due to change in the environment, the amount of wave front aberration caused by the occurrence of astigmatic distance due to change in the distance s can be limited to a sufficiently small value by limiting the thickness t of the core of the beam shaping element (L) to a specific value, or less, (for example, several mm or less). For the purpose of comparison with the present embodiment, FIG. 2 shows an optical pickup system provided with a beam shaping element having a collimating function according to a prior art. In FIG. 2 the point of light emission of a semiconductor laser is denoted as 10, a cover glass is denoted as 11, a beam shaping element having a collimating function is denoted as 12, an object lens is denoted as 13 and an optical disk is denoted as 14.

In the beam shaping element (12) having a collimating function, the dimension of the diameter of the beam after collimation needs to be approximately 4 mm. This is because a specific width of the incident beam becomes necessary since the beam is narrowed down to a microscopic spot using the high NA object lens (13) at a rear stage. In the case that the diameter of the beam after collimation is small, the focal distance of the high NA object lens (13) becomes too small to allow easy fabrication of the object lens (13). In the beam shaping element (12), according to the prior art shown in FIG. 2, having the beam entering angle such that, for example, the diameter of the emitted beam is 4 mm, the NA in the X direction is 0.1, the NA in the Y direction is 0.2 and the thickness t of the core is within the range of the above described condition expression (5), 20 mm is necessary for the focal distance in the XZ cross section and 10 mm is necessary for the focal distance in the YZ cross section. In this case the thickness t of the core of the beam shaping element (12) cannot be made very small because of limitation in aberration correction.

[Embodiment of Optical Pickup]

Figure 3:
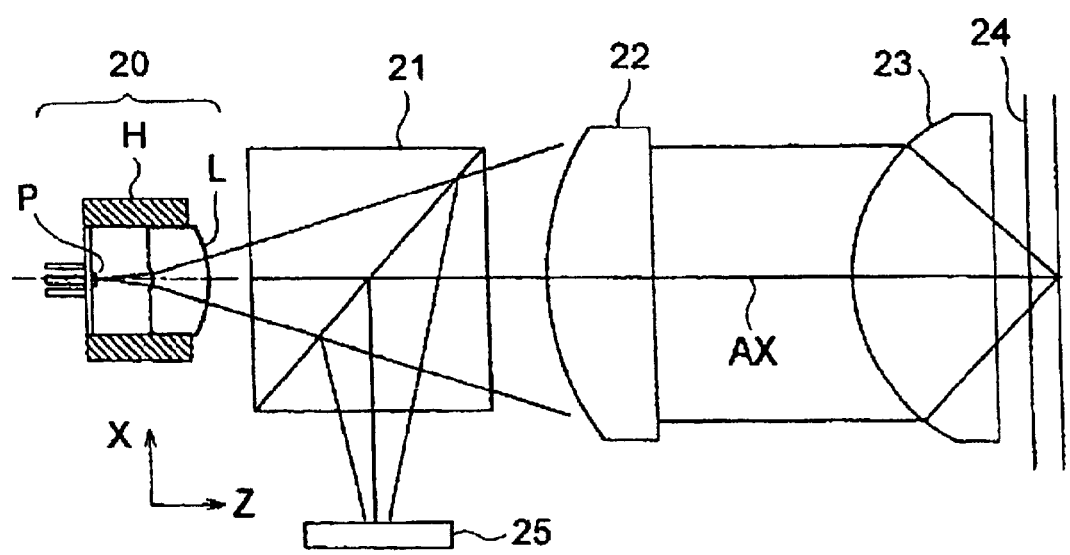
FIG. 3 is a system configuration diagram showing an embodiment of the optical pickup.

FIG. 3 shows an example of a system configuration of an optical pickup provided with a light source device according to the above described embodiment. In FIG. 3, a light source device according to the above described embodiment is denoted as 20, a PBS (polarizing beam splitter) prism is denoted as 21, a collimator lens is denoted as 22, an object lens is denoted as 23, an optical disk is denoted as 24 and a photodiode is denoted as 25. An elliptical divergent beam having a light intensity distribution in an elliptical form is emitted from the semiconductor laser (P) and this elliptical divergent beam is converted to an approximately circular divergent beam having a light intensity distribution in an approximately circular form by the beam shaping element (L). Accordingly, an approximately circular divergent beam is emitted from the light source device (20) and, at the same time, the occurrence of astigmatic difference due to change in the environmental temperature is restricted. In addition, miniaturization of an optical pickup has been achieved by utilizing an integrated and miniaturized light source device (20).

An approximately circular divergent beam emitted from the light source device (20) passes through the PBS prism (21) and, after that, the light of the beam is made parallel by means of the collimator lens (22). This beam of parallel light is narrowed down by the object lens (23) to a microscopic spot at the focal point position. Then, this beam is reflected from the recording surface of the optical disk (24) located at the focal point position of the object lens (23) and, again, enters the object lens (23). The beam converged by means of the object lens (23) is reflected from the PBS prism 21 so as to enter the photodiode (25). The photodiode (25) converts the change in the amount of light, or the like, into an electrical signal, which is outputted.

In the following, an optical configuration of a light source device gained by implementing the present invention is, further, concretely described by citing construction data. Examples 1 to 3 cited herein correspond to the above described embodiments, and the schematic configurations of Examples 1 to 3 are shown in FIG. 1. In each piece of construction data an object surface {corresponding to the position of the point of light emission of the semiconductor laser (P)} is denoted as S0, the first surface of the beam shaping element (L) is denoted as S1, the second surface of the beam shaping element (L) is denoted as S2, radii (mm) of curvature in the X and Y directions of the surface Si (i=0, 1 or 2) are denoted as RDXi (i=0, 1 or 2) and RDYi (i=0, 1 or 2) and the distances (mm) between the surfaces along the axes are denoted as s and t as described above. The design wavelength $\lambda 0$ in each example is 405 nm of a blue violet semiconductor laser and the shaping magnification M in each example is 2 (M=2). The index n of refraction with respect to the design wavelength $\lambda 0$ and the indices of refraction corresponding to other wavelengths $\lambda a$ and $\lambda b$, together, are shown and, in addition, the corresponding values of the respective conditional expressions and related data are shown in Table 1.

Each of surfaces (S1 and S2) of the beam shaping element (L) is a cylindrical surface or an anamorphic surface, which is a surface form defined by the following equation (AAS) and the corresponding data is shown, together with the radii (RDXi and RDYi) of curvature.

$$Z = (CUX \cdot X^2 + CUY \cdot Y^2)/[1 + \sqrt{1 - (1+KX)CUX_2 \cdot X^2 - (1+KY)CUY^2 \cdot Y^2}] + [AR\{(1-AP)X^2 + (1+AP)Y^2\}^2 + BR\{(1-BP)X^2 + (1+BP)Y^2\}^3 + CR\{(1-CP)X^2 + (1+CP)Y^2\}^4 + DR\{(1-DP)X^2 + (1+DP)Y^2\}^5] \ldots (AAS)$$

where

Z is the amount of displacement (sag) from the reference surface in the Z direction;

CUX is the paraxial curvature (=1/RDXi) in the X direction;

CUY is the paraxial curvature (=1/RDYi) in the Y direction;

KX is the conic constant in the X direction;

KY is the conic constant in the Y direction;

AR, BR, CR, DR are rotational symmetry factors of the fourth order, sixth order, eighth order and tenth order coefficient of deformation from a cone; and AP, BP, CP, DP are non-rotational symmetry factors of the fourth order, sixth order, eighth order and tenth order coefficient of deformation from a cone.

| [Surface] | [Radius of Curvature] | [Axial Distance] |
| --- | --- | --- |

Example 1

S0  RDX0 = ∞, RDY0 = ∞
    s = 0.670000
S1  RDX1 = −0.23938, RDY1 = ∞
    KX = 0.000000, KY = 0.000000
    AR = 0.000000, BR = 0.000000, CR = 0.000000, DR = 0.000000
    AP = 0.000000, BP = 0.000000, CP = 0.000000, DP = 0.000000
        t = 1.000000
S2  RDX2 = −1.06500, RDY2 = −3.13117
    KX = 0.000000, KY = 0.000000
    AR = 0.341015 × $10^{-2}$, BR = 0.682480 × $10^{-1}$, CR = 0.000000, DR = 0.000000
    AP = 0.209514 × 10, BP = −0.153341, CP = 0.100000 × 10, DP = 0.100000 × 10

[Refractive Index]

1.797682($\lambda a$ = 410.00 nm), 1.798952($\lambda 0$ = 405.00 nm), 1.800272($\lambda b$ = 400.00 nm)

Example 2

S0  RDX0 = ∞, RDY0 = ∞
    s = 0.670000
S1  RDX1 = −0.23938, RDY1 = ∞
    KX = 0.000000, KY = 0.000000
    AR = 0.546620, BR = −0.556547 × 10, CR = 0.000000, DR = 0.000000
    AP = −0.100000 × 10, BP = −0.100000 × 10, CP = 0.000000, DP = 0.000000
        t = 1.000000
S2  RDX2 = −1.06500, RDY2 = −3.13117
    KX = 0.000000, KY = 0.000000
    AR = 0.167891 × $10^{-2}$, BR = 0.813509 × $10^{-2}$, CR = 0.000000, DR = 0.000000
    AP = 0.323028 × 10, BP = −0.444868, CP = 0.100000 × 10, DP = 0.100000 × 10

[Refractive Index]

1.797682($\lambda a$ = 410.00 nm), 1.798952($\lambda 0$ = 405.00 nm), 1.800272($\lambda b$ = 400.00 nm)

Example 3

S0  RDX0 = ∞, RDY0 = ∞
    s = 0.830000
S1  RDX1 = −0.50802, RDY1 = ∞
    KX = 0.000000, KY = 0.000000
    AR = 0.542347 × $10^{-1}$, BR = 0.194762 × $10^{-1}$, CR = 0.000000, DR = 0.000000
    AP = −0.100000 × 10, BP = −0.100000 × 10, CP = 0.000000, DP = 0.000000
        t = 2.000000

-continued

| [Surface] | [Radius of Curvature] | [Axial Distance] |
|---|---|---|
| S2 | RDX2 = −2.34500, RDY2 = −4.39503 | |
| | KX = 0.000000, KY = 0.000000 | |
| | AR = 0.498650 × $10^{-3}$, BR = 0.294163 × $10^{-3}$, CR = 0.000000, DR = 0.000000 | |
| | AP = 0.226462 × 10, BP = 0.429160, CP = 0.100000 × 10, DP = 0.100000 × 10 | |

[Refractive Index]

1.636877($\lambda a$ = 410.00 nm), 1.637693($\lambda 0$ = 405.00 nm), 1.638540($\lambda b$ = 400.00 nm)

[Corresponding Values for Conditional Expressions]

| | Condition 1 | | | Condition 2 | | | Condition 3 | Condition 4 | |
| | [radian] | | | [radian] | | | | (n-M/n)/ | |
| Example | θ | θX' | nθX | θY | θY' | (1/n) θY | M/n | s/t | (M-1) |
|---|---|---|---|---|---|---|---|---|---|
| 1 | 0.1 | 0.14 | 0.180 | 0.2 | 0.14 | 0.111 | 1.11 | 0.670 | 0.687 |
| 2 | 0.1 | 0.14 | 0.180 | 0.2 | 0.14 | 0.111 | 1.11 | 0.670 | 0.687 |
| 3 | 0.1 | 0.14 | 0.164 | 0.2 | 0.14 | 0.122 | 1.22 | 0.415 | 0.416 |

In Example 1 the NA is converted from 0.10 to 0.14 in the X direction wherein the angle of spread is small while the NA is converted from 0.20 to approximately 0.14 in the Y direction wherein the angle of spread is large of the elliptical divergent beam from semiconductor laser (P). At this time the remaining wave front aberration is 0.001λ (RMS value), or less, which indicates a sufficient performance.

In Example 2 the first surface (S1) is formed of a cylindrical surface in a non-spherical surface form. The NA is converted from 0.10 to 0.14 in the X direction wherein the angle of spread is small while the NA is converted from 0.20 to approximately 0.14 in the Y direction wherein the angle of spread is large of the elliptical divergent beam from semiconductor laser (P). At this time the remaining wave front aberration is 0.001λ (RMS value), or less, which indicates a sufficient performance. In addition, the remaining wave front aberration of the field angle of 0.5 degrees is 0.003λ (RMS value), or less, which indicates a sufficient performance even in reference to the performance outside of the axis.

In Example 3 the NA is converted from 0.10 to 0.14 in the X direction wherein the angle of spread is small while the NA is converted from 0.20 to approximately 0.14 in the Y direction wherein the angle of spread is large of the elliptical divergent beam from semiconductor laser (P). At this time the remaining wave front aberration is 0.001λ (RMS value), or less, which indicates a sufficient performance. In addition, the remaining wave front aberration of the field angle of 0.5 degrees is 0.002λ (RMS value), or less, which indicates a sufficient performance even in reference to the performance outside of the axis.

As described above, according to a light source device of the present invention, an approximately circular divergent beam can be emitted while, at the same time, the occurrence of astigmatic difference due to change in the environmental temperature is restricted and manufacture thereof can easily be carried out. Moreover, miniaturization of an optical pickup can be achieved using a light source device according to the present invention.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

What is claimed is:

1. A light source device comprising:

a semiconductor laser for emitting an elliptical divergent beam having a light intensity distribution in an elliptical form; and a beam shaping element for converting the elliptical divergent beam from said semiconductor laser into an approximately circular divergent beam having a light intensity distribution in an approximately circular form;

wherein the beam shaping element has a first surface formed of a cylindrical surface and a second surface formed of an anamorphic surface, in order from said semiconductor laser side, and satisfies the following conditional expressions (1) and (2) when a direction parallel to a minor axis of an ellipse of the elliptical divergent beam is the X direction and a direction parallel to a major axis of the ellipse of the elliptic divergent beam is the Y direction:

$$\theta X < \theta X' < n\theta X \qquad (1)$$

$$\theta Y < \theta Y' < (1/n)\theta Y \qquad (2)$$

where

θX is an angle of spread in the X direction of the elliptical divergent beam from the semiconductor laser;

θY is an angle of spread in the Y direction of the elliptical divergent beam from the semiconductor laser;

θX' is an angle of spread in the X direction of the approximately circular divergent beam from the beam shaping element;

θY' is an angle of spread in the Y direction of the approximately circular divergent beam from the beam shaping element; and n is an index of refraction of the beam shaping element at a design wavelength.

2. A light source device as claimed in claim 1, further comprising a support member for integrally supporting both said semiconductor laser and said beam shaping element.

3. A light source device as claimed in claim 1, wherein the following conditional expressions (3), (4) and (5) are satisfied:

$$n > 1.6 \quad (3)$$
$$1.1n < M < 1.5n \quad (4)$$
$$s/t \approx (n - M/n)/(M-1) \quad (5)$$

where
- M is a shaping magnification of the beam shaping element;
- s is a distance between a light emission point of the semiconductor laser and the first surface of the beam shaping element; and
- t is a thickness of the core of the beam shaping element.

4. A light source device as claimed in claim 1, wherein the approximately circular divergent beam converted by the beam shaping element is a spherical surface wave.

5. A light source device as claimed in claim 1, wherein the beam shaping element has differing focal distances in the XZ cross section and in the YZ cross section.

6. A light source device as claimed in claim 1, wherein the beam shaping element converts a numerical aperture of the elliptical divergent beam from the semiconductor laser.

7. A light source device comprising:
a semiconductor laser for emitting an elliptical divergent beam having a light intensity distribution in an elliptical form; and
a finite system beam shaping element for converting the elliptical divergent beam from said semiconductor laser into an approximately circular divergent beam having a light intensity distribution in an approximately circular form;
wherein the beam shaping element has a first surface formed of a cylinder surface and a second surface formed of an anamorphic surface in order from said semiconductor laser side and is characterized by satisfying the following conditional expressions (3), (4) and (5):

$$n1.6 \quad (3)$$
$$1.1n < M < 1.5n \quad (4)$$
$$s/t \approx (n - M/n)/(M-1) \quad (5)$$

where
- n is an index of refraction of the beam shaping element at a design wavelength;
- M is a shaping magnification of the beam shaping element;
- s is a distance between a light emission point of the semiconductor laser and the first surface of the beam shaping element; and
- t is a thickness of the core of the beam shaping element.

8. A light source device as claimed in claim 7, further comprising a support member for integrally supporting both said semiconductor laser and said beam shaping element.

9. A light source device as claimed in claim 7, wherein the approximately circular divergent beam convened by the beam shaping element is a spherical surface wave.

10. A light source device as claimed in claim 7, wherein the beam shaping element has differing focal distances in the XZ cross section and in the YZ cross section.

11. An optical pickup device comprising:
a light source device for emitting an approximately circular divergent beam;
a collimator lens for forming an approximately circular divergent beam from the light source device into a parallel beam; and
an object lens for focusing the parallel beam onto a surface to be focused,
wherein the light source device comprises:
a semiconductor laser for emitting an elliptical divergent beam having a light intensity distribution in an elliptical form; and
a beam shaping element for converting the elliptical divergent beam from said semiconductor laser into an approximately circular divergent beam having a light intensity distribution in an approximately circular form;
wherein the beam shaping element has a first surface formed of a cylindrical surface and a second surface formed of an anamorphic surface, in order from said semiconductor laser side, and satisfies the following conditional expressions (1) and (2) when a direction parallel to a minor axis of an ellipse of the elliptical divergent beam is the X direction and a direction parallel to a major axis of the ellipse of the elliptic divergent beam is the Y direction:

$$\theta X < \theta X' < n\theta X \quad (1)$$
$$\theta Y < \theta Y' > (1/n)\theta Y \quad (2)$$

where
- $\theta X$ is an angle of spread in the X direction of the elliptical divergent beam from the semiconductor laser;
- $\theta Y$ is an angle of spread in the Y direction of the elliptical divergent beam from the semiconductor laser;
- $\theta X'$ is an angle of spread in the X direction of the approximately circular divergent beam from the beam shaping element;
- $\theta Y'$ is an angle of spread in the Y direction of the approximately circular divergent beam from the beam shaping element; and
- n is an index of refraction of the beam shaping element at a design wavelength.

12. An optical pickup device as claimed in claim 11, further comprising a support member for integrally supporting both said semiconductor laser and said beam shaping element.

13. An optical pickup device as claimed in claim 11, wherein the approximately circular divergent beam convened by the beam shaping element is a spherical surface wave.

14. An optical pickup device as claimed in claim 11, wherein the beam shaping element has differing focal distances in the XZ cross section and in the YZ cross section.

15. An optical pickup device as claimed in claim 11, wherein the beam shaping element converts a numerical aperture of the elliptical divergent beam from the semiconductor laser.

16. An optical pickup device comprising:
a light source device for emitting an approximately circular divergent beam;
a collimator lens for forming an approximately circular divergent beam from the light source device into a parallel beam; and
an object lens for focusing the parallel beam onto a surface to be focused, wherein the light source device comprises:
- a semiconductor laser for emitting an elliptical divergent beam having a light intensity distribution in an elliptical form; and
- a finite system beam shaping element for converting the elliptical divergent beam from said semiconductor laser into the approximately circular divergent beam having a light intensity distribution in an approximately circular form;
- wherein the beam shaping element has a first surface formed of a cylinder surface and a second surface formed of an anamorphic surface in order from said semiconductor laser side and is characterized by satisfying the following conditional expressions (3), (4) and (5):

$$n1.6 \quad (3)$$

$$1.1n<M<1.5n \quad (4)$$

$$s/t \approx (n-M/n)/(M{-}1) \quad (5)$$

where
- n is an index of refraction of the beam shaping element at a design wavelength;
- M is a shaping magnification of the beam shaping element;
- s is a distance between a light emission point of the semiconductor laser and the first surface of the beam shaping element; and
- t is a thickness of a core of the beam shaping element.

17. An optical pickup device as claimed in claim 16, further comprising a support member for integrally supporting both said semiconductor laser and said beam shaping element.

18. An optical pickup device as claimed in claim 16, wherein the approximately circular divergent beam convened by the beam shaping element is a spherical surface wave.

19. An optical pickup device as claimed in claim 16, wherein the beam shaping element has differing focal distances in the XZ cross section and in the YZ cross section.

20. A beam shaping element for converting an elliptical divergent beam into an approximately circular divergent beam having a light intensity distribution in an approximately circular form, the beam shaping element comprising:
- a first surface formed of a cylindrical surface, and
- a second surface formed of an anamorphic surface, in order from an incident side of the elliptical divergent beam,
- wherein the beam shaping element satisfies the following conditional expressions (1) and (2) when a direction parallel to a minor axis of an ellipse of the elliptical divergent beam is the X direction and a direction parallel to a major axis of the ellipse of the elliptic divergent beam is the Y direction:

$$\theta X<\theta X'<n\theta X \quad (1)$$

$$\theta Y>\theta Y'>(1/n)\theta Y \quad (2)$$

where
- θX is an angle of spread in the X direction of the elliptical divergent beam from a semiconductor laser;
- θY is an angle of spread in the Y direction of the elliptical divergent beam from the semiconductor laser;
- θX' is an angle of spread in the X direction of the approximately circular divergent beam from the beam shaping element;
- θY' is an angle of spread in the Y direction of the approximately circular divergent beam from the beam shaping element; and
- n is an index of refraction of the beam shaping element at a design wavelength.

21. A beam shaping element as claimed in claim 20, wherein the following conditional expressions (3), (4) and (5) are satisfied:

$$n1.6 \quad (3)$$

$$1.1n<M<1.5n \quad (4)$$

$$s/t \approx (n-M/n)/(M-1) \quad (5)$$

where
- M is a shaping magnification of the beam shaping element;
- s is a distance between a light emission point of the semiconductor laser and the first surface of the beam shaping element; and
- t is a thickness of the core of the beam shaping element.

22. A beam shaping element for converting an elliptical divergent beam into an approximately circular divergent beam having a light intensity distribution in an approximately circular form, the beam shaping element comprising:
- a first surface formed of a cylindrical surface, and
- a second surface formed of an anamorphic surface, in order from an incident side of the elliptical divergent beam,
- wherein the beam shaping element satisfies the following conditional expressions (3), (4) and (5):

$$n1.6 \quad (3)$$

$$1.1n<M<1.5n \quad (4)$$

$$s/t \approx (n-M/n)/(M-1) \quad (5)$$

where
- n is an index of refraction of the beam shaping element at a design wavelength;
- M is a shaping magnification of the beam shaping element;
- s is a distance between a light emission point of the semiconductor laser and the first surface of the beam shaping element; and
- t is a thickness of the core of the beam shaping element.

* * * * *

UNITED STATES PATENT AND TRADEMARK OFFICE
CERTIFICATE OF CORRECTION

PATENT NO. : 6,829,284 B2
DATED : December 7, 2004
INVENTOR(S) : Yuichiro Ori

It is certified that error appears in the above-identified patent and that said Letters Patent is hereby corrected as shown below:

Column 8,
Line 5, delete "$Z = (CUX.X^2+CUY\cdot Y^2)/[1+\sqrt{1-(1+KX)CUX_2\cdot X^2-(1+}$" and insert -- $Z = (CUX\cdot X^2+CUY\cdot Y^2)/[1+\sqrt{1-(1+KX)CUX^2\cdot X^2\cdot X^2-(1+}$ --.

Column 10,
Line 53, delete "$\theta Y < \theta Y' < (1/n)\theta Y$" and insert -- $\theta Y > \theta Y' > (1/n)\theta Y$ --.

Column 11, 12, 13,
Lines 16, 19, 44 and 45, delete "n1.6" and insert -- $n > 1.6$ --.
Lines 63, 51 and 38, delete "convened" and insert -- converted --.

Column 12,
Line 30, delete "$\theta Y < \theta Y' > (1/n)\theta Y$" and insert -- $\theta Y > \theta Y' > (1/n)\theta Y$ --.

Column 13,
Line 20, delete "$s/t \approx (n-M/n)/(M31\ 1)$" and insert -- $s/t \approx (n-M/n)/M-1$ --.

Signed and Sealed this

Twenty-sixth Day of April, 2005

JON W. DUDAS
*Director of the United States Patent and Trademark Office*

UNITED STATES PATENT AND TRADEMARK OFFICE
CERTIFICATE OF CORRECTION

PATENT NO. : 6,829,284 B2
DATED : December 7, 2004
INVENTOR(S) : Yuichiro Ori

It is certified that error appears in the above-identified patent and that said Letters Patent is hereby corrected as shown below:

Column 8,
Line 5, delete "$Z = (CUX.X^2+CUY\cdot Y^2) /[1+\sqrt{} \{1-(1+KX)CUX_2\cdot X^2-(1+$" and insert -- $Z = (CUX\cdot X^2+CUY\cdot Y^2) /[1+\sqrt{}\{1-(1+KX)CUX^2\cdot X^2\cdot(1+$ --.

Column 10,
Line 53, delete "$\theta Y < \theta Y' < (1/n)\theta Y$" and insert -- $\theta Y > \theta Y' > (1/n)\theta Y$ --.

Columns 11, 13 and 14,
Lines 16, 19, 44 and 45, delete "n1.6" and insert -- $n > 1.6$ --.

Columns 11, 12 and 13,
Lines 63, 51 and 38, delete "convened" and insert -- converted --.

Column 12,
Line 30, delete "$\theta Y < +\theta Y' > (1/n)\theta Y$" and insert -- $\theta Y > \theta Y' > (1/n)\theta Y$ --.

Column 13,
Line 20, delete "$s/t \approx (n-N/n)/M31\ 1$" and insert -- $s/t \approx (n-M/n)/M-1$ --.

This certificate supersedes Certificate of Correction issued April 26, 2005.

Signed and Sealed this

Nineteenth Day of July, 2005

JON W. DUDAS
*Director of the United States Patent and Trademark Office*